US012710697B2

(12) United States Patent
Feng et al.

(10) Patent No.: US 12,710,697 B2
(45) Date of Patent: Aug. 18, 2026

(54) OVERLAY MARK, OVERLAY ERROR MEASUREMENT METHOD FOR WAFER, AND WAFER STACKING METHOD

(71) Applicant: WUHAN XINXIN SEMICONDUCTOR MANUFACTURING CO., LTD., Wuhan (CN)

(72) Inventors: Yicheng Feng, Wuhan (CN); Yuheng Huang, Wuhan (CN); Bang Chen, Wuhan (CN)

(73) Assignee: WUHAN XINXIN SEMICONDUCTOR MANUFACTURING CO., LTD., Wuhan (CN)

( * ) Notice: Subject to any disclaimer, the term of this patent is extended or adjusted under 35 U.S.C. 154(b) by 655 days.

(21) Appl. No.: 18/169,219

(22) Filed: Feb. 15, 2023

(65) Prior Publication Data

US 2023/0194998 A1 Jun. 22, 2023

Related U.S. Application Data

(63) Continuation of application No. PCT/CN2021/078899, filed on Mar. 3, 2021.

(30) Foreign Application Priority Data

Sep. 18, 2020 (CN) ......................... 202010988212.0

(51) Int. Cl.
*G03F 7/00* (2006.01)
*G03F 9/00* (2006.01)

(52) U.S. Cl.
CPC ...... *G03F 7/70633* (2013.01); *G03F 7/70625* (2013.01); *G03F 9/7046* (2013.01)

(58) Field of Classification Search
CPC ............. G03F 7/70633; G03F 7/70625; G03F 9/7046; G03F 7/70683; G03F 9/7073;
(Continued)

(56) References Cited

U.S. PATENT DOCUMENTS 9,754,895 B1 9/2017 Chao et al.
2009/0040536 A1 2/2009 Chiu et al.
(Continued)

FOREIGN PATENT DOCUMENTS

CN 101937904 A 1/2011
CN 108417562 A 8/2018
(Continued)

OTHER PUBLICATIONS

Liu; Cheng-Cheng, CN-111522210-A, Machine Translation (Year: 2020).*

(Continued)

*Primary Examiner* — Jacob Y Choi
*Assistant Examiner* — Grace Cha

(57) ABSTRACT

The present disclosure provides an overlay mark, an overlay error measurement method for a wafer, and a wafer stacking method. The overlay mark includes a first overlay mark disposed on a first layer, and a second overlay mark disposed on a second layer. The first layer and the second layer are stacked. The first overlay mark includes at least one first overlay sub-mark, and each of the at least one first overlay sub-mark is circular in shape. The second overlay mark includes a second overlay sub-mark, and the second overlay sub-mark is in a center-symmetrical shape including a plurality of linear graphics.

19 Claims, 6 Drawing Sheets

(58) Field of Classification Search
CPC ....... H01L 23/544; H01L 22/12; H01L 22/20; H01L 2223/54426
See application file for complete search history.

(56) References Cited

U.S. PATENT DOCUMENTS

| | | | | |
|---|---|---|---|---|
| 2009/0100391 | A1 | 4/2009 | Van Der Heijden et al. | |
| 2012/0248624 | A1 | 10/2012 | Endo | |
| 2013/0168681 | A1* | 7/2013 | Suzuki | H10D 30/0316 438/34 |
| 2020/0233312 | A1* | 7/2020 | Kim | G03F 7/70058 |

FOREIGN PATENT DOCUMENTS

| | | | | |
|---|---|---|---|---|
| CN | 109904105 A | | 6/2019 | |
| CN | 110416078 A | * | 11/2019 | H10P 90/126 |
| CN | 111312691 A | | 6/2020 | |
| CN | 111415859 A | | 7/2020 | |
| CN | 111522209 A | | 8/2020 | |
| CN | 111522210 A | * | 8/2020 | G03F 7/70683 |
| CN | 112201645 A | | 1/2021 | |
| CN | 114446908 A | | 5/2022 | |
| KR | 20050091869 A | | 9/2005 | |
| WO | WO2004090980 A2 | | 10/2004 | |

OTHER PUBLICATIONS

Zhao; Chang-lin, CN-110416078-A, Machine Translation (Year: 2019).*

International search report and Written Opinion of the International Search Authority,International Application No. PCT/CN2021/078899,mailed Jun. 15, 2021(12 pages).

Chinese office action,Application No. 202010988212.0,mailed Jan. 4, 2023(26 pages).

Chinese Second Office Action,Chinese Application No. 202010988212.0, mailed Jul. 12, 2023 (22 pages).

* cited by examiner

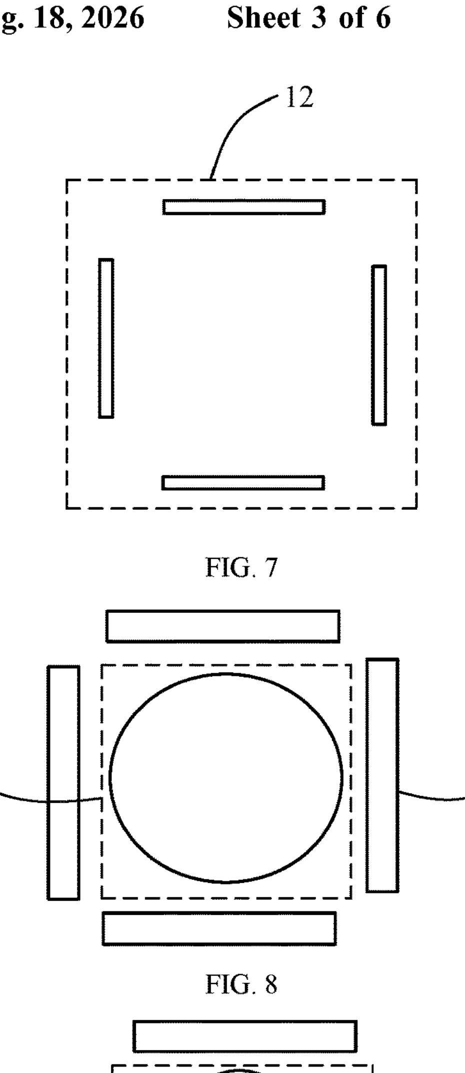
FIG. 7
FIG. 8
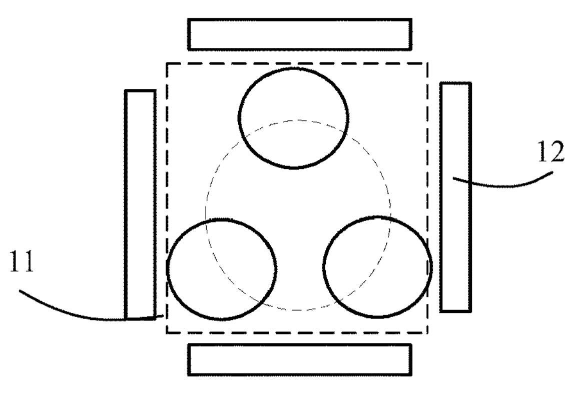
FIG. 9
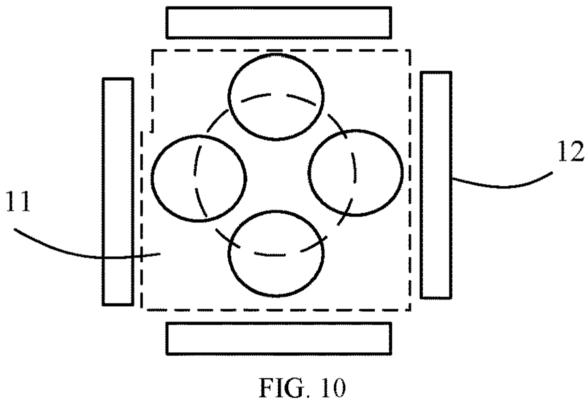
FIG. 10

OVERLAY MARK, OVERLAY ERROR MEASUREMENT METHOD FOR WAFER, AND WAFER STACKING METHOD

CROSS REFERENCE

The present application is a continuation-application of International (PCT) Patent Application No. PCT/CN2021/078899, filed on Mar. 3, 2021, which claims foreign priority of Chinese Patent Application No. 202010988212.0, filed on Sep. 18, 2020, the entire contents of which are hereby incorporated by reference in its entirety.

TECHNICAL FIELD

The present disclosure relates to the field of integrated circuit technologies, and in particular to an overlay mark, an overlay error measurement method for a wafer, and a wafer stacking method.

BACKGROUND

An overlay error refers to an offset value between two adjacent layers of patterns of a wafer. Since an integrated circuit (IC) chip is manufactured by stacking multiple layers, if adjacent layers are not aligned, the chip will not work properly. Therefore, it is especially important to ensure the alignment of wafer adjacent layers.

Conventionally, in order to align two adjacent layers, a first alignment mark is disposed on a current layer and a second alignment mark is disposed on a previous layer, and the overlay error of the current layer is obtained based on the first alignment mark and the second alignment mark.

However, in a case of a layer that requires a hole-opening process, it is not possible to design a normal pattern to measure the overlay error of the current layer due to its special process requirements.

SUMMARY OF THE DISCLOSURE

The present disclosure provides an overlay mark, an overlay error measurement method for a wafer, and a wafer stacking method.

A technical solution adopted by the present disclosure is to provide an overlay mark, including: a first overlay mark disposed on a first layer, and a second overlay mark disposed on a second layer; wherein the first layer and the second layer are stacked; the first overlay mark includes at least one first overlay sub-mark, and each of the at least one first overlay sub-mark is circular in shape; the second overlay mark includes a second overlay sub-mark, and the second overlay sub-mark is in a center-symmetrical shape including a plurality of linear graphics.

In some embodiments, the first overlay mark is configured to measure an overlay error of a wafer required to be subjected to a circular hole-opening process, and the first overlay mark is formed at the same time as a circular hole is formed during the circular hole-opening process.

In some embodiments, the number of the at least one first overlay sub-mark is one, and the at least one first overlay sub-mark is disposed in a non-device area of the wafer.

In some embodiments, the number of the at least one first overlay sub-mark is two or more, and the at least one first overlay sub-mark are distributed along a same circumference and disposed in a non-device area of the first layer.

In some embodiments, a distance between every two adjacent ones of the at least one first overlay sub-mark is the same.

In some embodiments, a distance between every two adjacent ones of at least two of the at least one first overlay sub-mark is the same.

In some embodiments, the second overlay sub-mark is in a shape composed of a first group of linear graphics and a second group of linear graphics, the first group of linear graphics including two first linear graphics parallel to each other, the second group of linear graphics including two second linear graphics parallel to each other, and the second linear graphics being perpendicular to the first linear graphics.

In some embodiments, each end of each of the two first linear graphics is connected to a corresponding second linear graphic to form a closed graphic.

In some embodiments, neither of the two first linear graphics and the two second linear graphics are connected.

In some embodiments, a projection of the first overlay mark on the second layer is located in a closed area enclosed by the second overlay mark, and the projection of the first overlay mark does not intersect with the second overlay mark.

In some embodiments, a projection of the first overlay mark on the second layer is located outside a closed area enclosed by the second overlay mark, and the projection of the first overlay mark does not intersect with the second overlay mark.

Another technical solution adopted by the present disclosure is to provide an overlay error measurement method for a wafer, including: determining a first overlay mark on a first layer and a second overlay mark on a second layer; wherein the first layer and the second layer are stacked; the first overlay mark includes at least one first overlay sub-mark, and each of the at least one first overlay sub-mark is circular in shape; the second overlay mark includes a second overlay sub-mark, and the second overlay sub-mark is in a center-symmetrical shape including a plurality of linear graphics; and measuring and obtaining an overlay error of the first layer based on the first overlay mark and the second overlay mark.

In some embodiments, the measuring and obtaining an overlay error of the first layer based on the first overlay mark and the second overlay mark includes: obtaining coordinates of a geometric center of the first overlay mark as first coordinates; obtaining coordinates of a geometric center of the second overlay mark as second coordinates; and obtaining a difference between the first coordinates and the second coordinates to obtain the overlay error of the first layer.

In some embodiments, the method further includes: obtaining a deflection angle of the first overlay mark relative to the second overlay mark.

In some embodiments, the obtaining a difference between the first coordinates and the second coordinates to obtain the overlay error of the first layer includes: obtaining a horizontal offset value of the first layer relative to the second layer in a horizontal axis direction and another horizontal offset value of the first layer relative to the second layer in a vertical axis direction through the first coordinates and the second coordinates; wherein the overlay error includes: the horizontal offset value in the horizontal axis direction, the horizontal offset value in the vertical axis direction, and the deflection angle.

In some embodiments, the measuring and obtaining an overlay error of the first layer based on the first overlay mark and the second overlay mark includes: obtaining a theoretical offset value between a geometric center of the first overlay mark and a geometric center of the second overlay mark; obtaining coordinates of the geometric center of the first overlay mark as first coordinates; obtaining coordinates of the geometric center of the second overlay mark as second coordinates; obtaining a difference between the first coordinates and the second coordinates as an actual offset value; and obtaining a difference between the actual offset value and the theoretical offset value to obtain the overlay error of the first layer.

In some embodiments, the obtaining a theoretical offset value between a geometric center of the first overlay mark and a geometric center of the second overlay mark includes: obtaining a theoretical deflection angle of the first overlay mark relative to the second overlay mark; obtaining coordinates of geometric centers of the first overlay mark and the second overlay mark; and obtaining a theoretical horizontal offset value of the first layer relative to the second layer in a horizontal axis direction and another theoretical horizontal offset value of the first layer relative to the second layer in a vertical axis direction through the coordinates of the geometric centers of the first overlay mark and the second overlay mark; wherein the theoretical offset value includes: the theoretical horizontal offset value in the horizontal axis direction, the theoretical horizontal offset value in the vertical axis direction, and the theoretical deflection angle.

In some embodiments, the method further includes: obtaining an actual deflection angle of the first overlay mark relative to the second overlay mark, simultaneously with the obtaining coordinates of the geometric center of the first overlay mark as first coordinates and the obtaining coordinates of the geometric center of the second overlay mark as second coordinates.

In some embodiments, the obtaining a difference between the first coordinates and the second coordinates as an actual offset value includes: obtaining an actual horizontal offset value of the first layer relative to the second layer in the horizontal axis direction and another actual horizontal offset value of the first layer relative to the second layer in the vertical axis direction through the first coordinates and the second coordinates; wherein the actual offset value includes: the actual horizontal offset value in the horizontal axis direction, the actual horizontal offset value in the vertical axis direction, and the actual deflection angle.

Further another technical solution adopted by the present disclosure is to provide a wafer stacking method, including: bonding a first wafer to a second wafer; wherein a first overlay mark is formed on the first wafer, and the first overlay mark is formed at the same time as a circular hole-opening process is performed; the first overlay mark includes at least one first overlay sub-mark, and each of the at least one first overlay sub-mark is circular in shape; a second overlay mark is formed on the second wafer; determining the first overlay mark on the first wafer and the second overlay mark on the second wafer; measuring and obtaining an overlay error of the first wafer based on the first overlay mark and the second overlay mark; and feedbacking the overlay error to an exposure system to compensate for a preparation process of a next batch of wafers.

BRIEF DESCRIPTION OF THE DRAWINGS

FIG. 7 is a structural schematic view of a second overlay sub-mark according to another embodiment of the present disclosure.

FIG. 8 is a schematic view of a position of a projection of a first overlay mark on a second layer and a position of a second overlay mark according to an embodiment of the present disclosure.

FIG. 9 is a schematic view of a position of a projection of a first overlay mark on a second layer and a position of a second overlay mark according to another embodiment of the present disclosure.

FIG. 10 is a schematic view of a position of a projection of a first overlay mark on a second layer and a position of a second overlay mark according to further another embodiment of the present disclosure.

DETAILED DESCRIPTION

Figure 1:
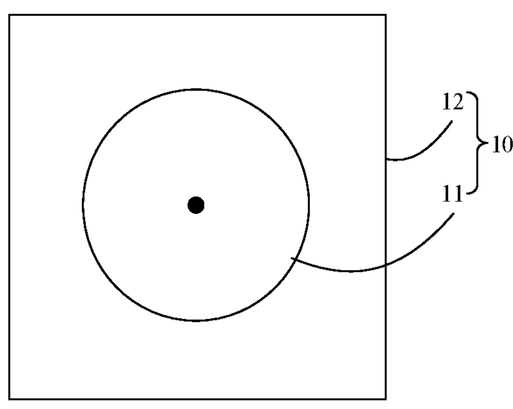
FIG. 1 is a structural schematic view of an overlay mark according to an embodiment of the present disclosure.

The technical solutions in the embodiments of the present disclosure will be clearly and completely described below with reference to the drawings in the embodiments of the present disclosure. Obviously, the described embodiments are only a part of the embodiments of the present disclosure, not all of the embodiments. Based on the embodiments in the present disclosure, all other embodiments obtained by those skilled in the art without creative work fall within the scope of the present disclosure.

The terms "first", "second" and "third" in the present disclosure are intended for descriptive purposes only and should not be construed as indicating or implying relative importance or implying the number of indicated technical features. Therefore, a feature defined as "first", "second", "third" may expressly or implicitly indicated that at least one of the features is included. In the description of the present disclosure, "a plurality of" means at least two, such as two, three, etc., unless otherwise expressly and specifically defined. All directional indications (such as up, down, left, right, front, rear . . . ) in the embodiments of the present disclosure are only intended to explain the relative positional relationship, motion situation, etc. between components under a certain posture (as shown in the accompanying drawings). When the certain posture changes, the directional indication also changes accordingly. Furthermore, the terms "include" and "have" and any variations thereof are intended to cover non-exclusive inclusion. For example, a process, method, system, product or device including a series of steps or units is not limited to the listed steps or units, but optionally further includes unlisted steps or units, or optionally further includes other steps or units that are inherent to the process, method, product, or device.

Reference herein to "embodiment" means that a particular feature, structure, or characteristic described in connection with the embodiment may be included in at least one embodiment of the present disclosure. The appearances of the phrase in various places in the specification are not necessarily all referring to a same embodiment, nor a separate or alternative embodiment that is mutually exclusive of other embodiments. It is explicitly and implicitly understood by those skilled in the art that the embodiments described herein may be combined with other embodiments.

During a stacking process of a wafer, it is often necessary to perform some deep-hole processes and perform a connection of subsequent processes. During the stacking process, in order to achieve alignment between adjacent layers, it is often necessary to design an overlay mark on a corresponding layer of the wafer for alignment. In the related art, the existing overlay mark is formed by etching a dicing lane of the wafer to form a rectangular opening through the wafer and filling the rectangular opening with a conductive material. However, since the rectangular opening has 4 corners, during the filling process of the conductive material in the rectangular opening, the conductive material is filled unevenly at the corners of the rectangular opening, resulting in the conductive material fault in the overlay mark. As the wafer thickness increases, especially when the wafer thickness is greater than 10 μm, the conductive material filling depth to width ratio increases, the above problem is more serious. The fault of the conductive material in the overlay mark will extend around the overlay mark and even extend to the device area, causing cracks inside the device. In this way, it is impossible to design the rectangular opening on the wafer to measure the overlay error of the current layer. Regarding this, embodiments of the present disclosure provide an overlay mark, which can be designed on a wafer required to be subjected to a hole-opening process, so as to apply the overlay mark to determine the overlay error of the wafer required to be subjected to a hole-opening process, thereby obtaining the overlay error process capability of the wafer, which effectively improves the product yield.

The present disclosure will be described in detail below with reference to the accompanying drawings and embodiments.

Figure 2:
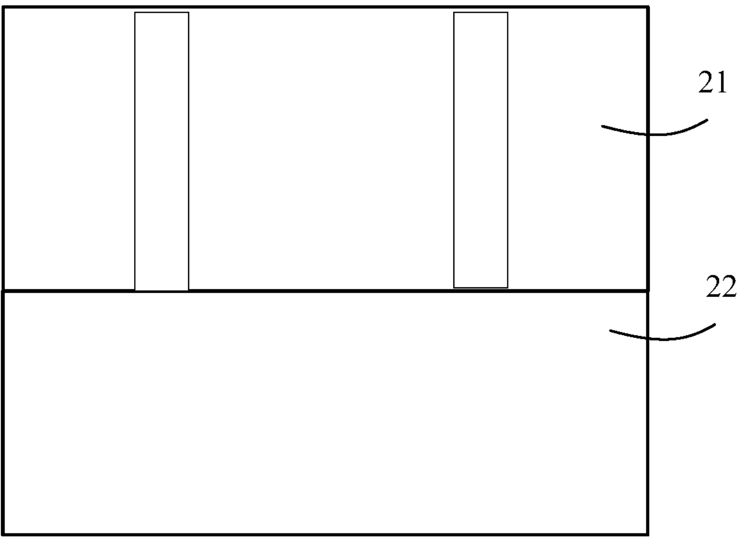
FIG. 2 is a schematic view of positions of a first layer and a second layer according to an embodiment of the present disclosure.

Referring to FIG. 1 and FIG. 2, FIG. 1 is a structural schematic view of an overlay mark according to an embodiment of the present disclosure, and FIG. 2 is a schematic view of positions of a first layer and a second layer according to an embodiment of the present disclosure. In the embodiments, an overlay mark 10 is provided, and the overlay mark 10 may be configured to measure an overlay error of a wafer required to be subjected to a hole-opening process. Specifically, the overlay mark 10 includes a first overlay mark 11 and a second overlay mark 12. The first overlay mark 11 is disposed on a first layer 21, and the second overlay mark 12 is disposed on a second layer 22. The first layer 21 and the second layer 22 are stacked.

The first overlay mark 11 may be specifically configured to measure the overlay error of the wafer required to be subjected to a circular hole-opening process, and the first overlay mark 11 is formed at the same time as a circular hole is formed.

Figure 3:
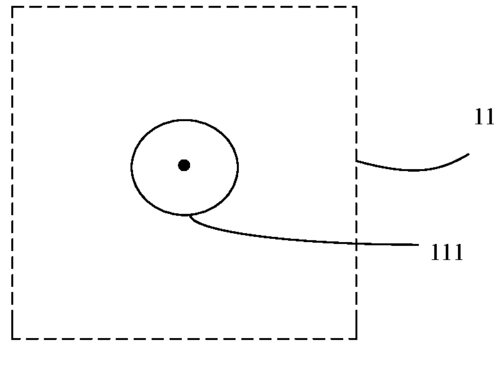
FIG. 3 is a structural schematic view of a first overlay mark according to an embodiment of the present disclosure.
Figure 4:
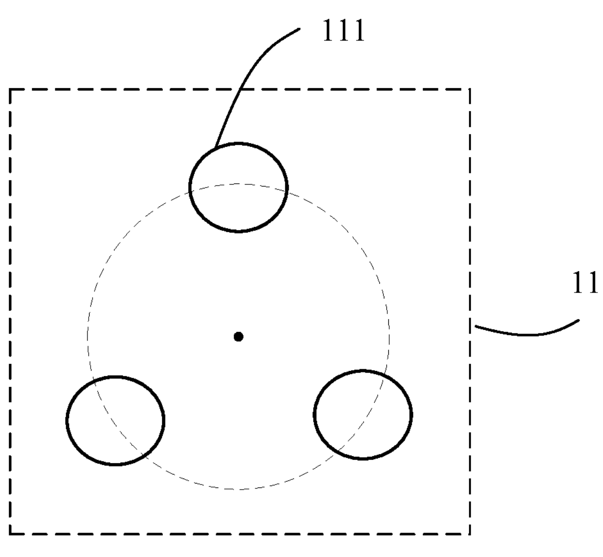
FIG. 4 is a structural schematic view of a first overlay mark according to another embodiment of the present disclosure.
Figure 5:
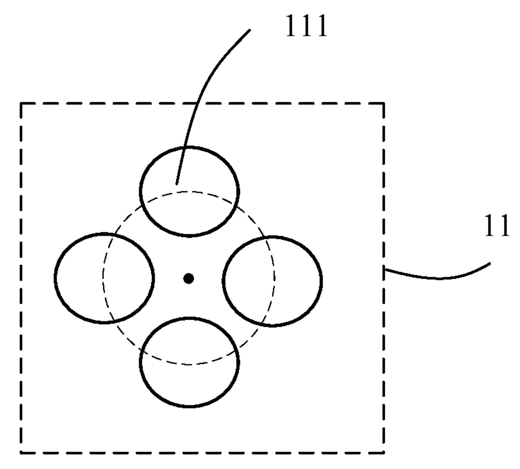
FIG. 5 is a structural schematic view of a first overlay mark according to further another embodiment of the present disclosure.

Referring to FIGS. 3 to 5, FIG. 3 is a structural schematic view of a first overlay mark according to an embodiment of the present disclosure, FIG. 4 is a structural schematic view of a first overlay mark according to another embodiment of the present disclosure, and FIG. 5 is a structural schematic view of a first overlay mark according to further another embodiment of the present disclosure. The first overlay mark 11 includes at least one first overlay sub-mark 111, and a cross-sectional shape of each first overlay sub-mark 111 is circular. Compared with the rectangular overlay sub-mark, the circular overlay sub-mark may prevent the fault of the conductive material in the first overlay sub-mark 111 caused by insufficient filling of the conductive material in the process of filling the conductive material in the first overlay sub-mark 111. In this way, the first overlay mark 11 is designed on the wafer required to be subjected to a hole-opening process. In a specific embodiment, the first overlay mark 11 may be specifically configured to measure the overlay error of the wafer required to be subjected to a circular hole-opening process, and the first overlay mark 11 is formed at the same time as a circular hole is formed. The first overlay sub-mark 111 of the first overlay mark 11 may specifically be a circular through hole, and an extension direction of the circular through hole is the same as an extension direction of another through hole defined on the first layer 21 of the wafer. The first overlay mark 11 may be at least one conductive hole defined on the first layer 21 for connecting the first layer 21 and the second layer 22. That is, the first overlay mark 11 may further serve as a conductive hole for electrically connecting the first layer 21 and the second layer 22.

In a specific embodiment, referring to FIG. 3, the first overlay mark 11 includes one first overlay sub-mark 111, and the first overlay sub-mark 111 is disposed in a non-device area of the wafer, that is, disposed in an area where no electronic devices are arranged. For example, the one first overlay sub-mark 111 is disposed at a position where a dicing line of the wafer is located, so as to avoid the position where the electronic devices are located.

In another specific embodiment, referring to FIGS. 4 and 5, the first overlay mark 11 includes at least two first overlay sub-marks 111, and the at least two first overlay sub-marks 111 are distributed along the same circumference, that is, centers of the at least two first overlay sub-marks 111 are on the same circle.

In some embodiments, a distance between every two adjacent first overlay sub-marks 111 is the same. For example, in a specific embodiment, the first overlay mark 11 includes three first overlay sub-marks 111, the three first overlay sub-marks 111 are distributed along the same circumference, and the centers of the three first overlay sub-marks 111 are located at three vertices of an equilateral triangle (as shown in FIG. 4). In another specific embodiment, the first overlay marks 11 includes four first overlay sub-marks 111, the four first overlay sub-marks 111 are distributed along the same circumference, and the centers of the four first overlay sub-marks 111 are located at four vertices of a square (as shown in FIG. 5).

Of course, in other embodiments, a distance between every two adjacent of at least two first overlay sub-marks 111 along the circumferential direction is the same. When the first overlay mark 11 includes three first overlay sub-marks 111, the centers of the three first overlay sub-marks 111 may be located at the three vertices of an isosceles triangle (not an equilateral triangle), or may be located at the three vertices of an equilateral triangle. When the first overlay mark 11 includes four first overlay sub-marks 111, the centers of the four first overlay sub-marks 111 may be located at the four vertices of an isosceles trapezoid, which is not limited herein, as long as at least two first overlay sub-marks 111 are distributed along the same circumference, that is, distributed around the same circle center.

The second overlay mark 12 includes a second overlay sub-mark, and the second overlay sub-mark is in a center-symmetrical shape including a plurality of linear graphics. Of course, in other embodiments, the second overlay mark 12 may be in a circular or asymmetrical shape, which is not limited herein.

Figure 6:
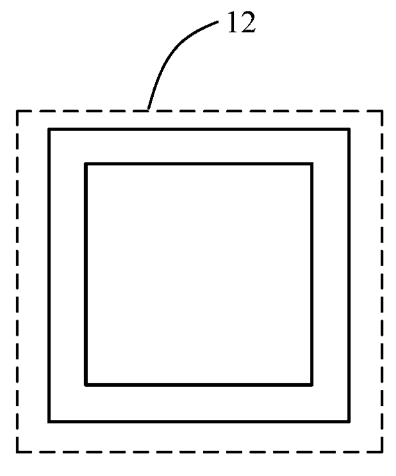
FIG. 6 is a structural schematic view of a second overlay sub-mark according to an embodiment of the present disclosure.

In some embodiment, referring to FIG. 6 and FIG. 7, FIG. 6 is a structural schematic view of a second overlay sub-mark according to an embodiment of the present disclosure, and FIG. 7 is a structural schematic view of a second overlay sub-mark according to another embodiment of the present disclosure. The second overlay sub-mark is in a shape composed of a first group of linear graphics and a second group of linear graphics, the first group of linear graphics including two parallel first linear graphics, the second group of linear graphics including two parallel second linear graphics, and the second linear graphics being perpendicular to the first linear graphics. In a specific embodiment, adjacent first linear graphic and second linear graphic are connected to each other to form a closed graphic (as shown in FIG. 6). In another specific embodiment, adjacent first linear graphic and second linear graphic are spaced apart to form a non-closed graphic (as shown in FIG. 7). The following will be described taking the above as examples.

In some embodiments, a projection of the first overlay mark 11 on the second layer 22 is located in a closed area enclosed by the second overlay mark 12, and the projection of the first overlay mark 11 does not intersect with the second overlay mark 12. Specifically, referring to FIGS. 8 to 10, FIG. 8 is a schematic view of a position of a projection of a first overlay mark on a second layer and a position of a second overlay mark according to an embodiment of the present disclosure, FIG. 9 is a schematic view of a position of a projection of a first overlay mark on a second layer and a position of a second overlay mark according to another embodiment of the present disclosure, and FIG. 10 is a schematic view of a position of a projection of a first overlay mark on a second layer and a position of a second overlay mark according to further another embodiment of the present disclosure. When the first overlay mark 11 includes one first overlay sub-mark 111, the projection of the first overlay mark 11 on the second layer 22 being located in the closed area enclosed by the second overlay mark 12 may be illustrated in FIG. 8. When the first overlay mark 11 includes three or four first overlay sub-marks 111, the projection of the first overlay mark 11 on the second layer 22 being located in the closed area enclosed by the second overlay mark 12 may be illustrated in FIGS. 9 and 10.

Figure 11:
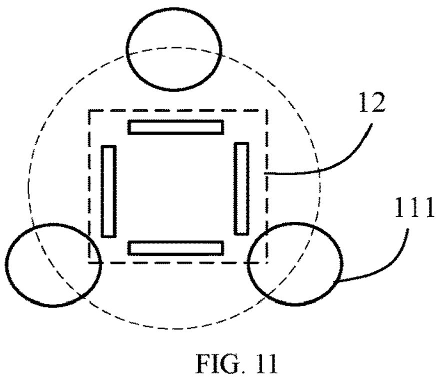
FIG. 11 is a schematic view of a position of a projection of a first overlay mark on a second layer and a position of a second overlay mark according to further another embodiment of the present disclosure.
Figure 12:
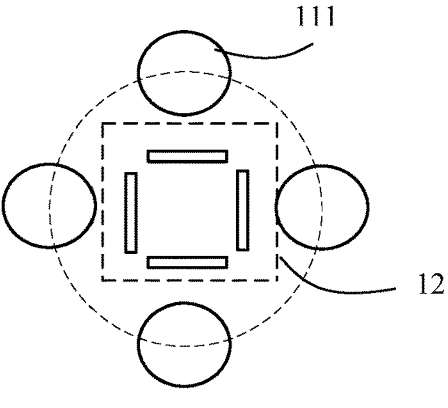
FIG. 12 is a schematic view of a position of a projection of a first overlay mark on a second layer and a position of a second overlay mark according to further another embodiment of the present disclosure.

In other embodiments, the projection of the first overlay mark 11 on the second layer 22 is located outside the closed area enclosed by the second overlay mark 12, and the projection of the first overlay mark 11 does not intersect with the second overlay mark 12. Specifically, referring to FIGS. 11 to 12, FIG. 11 is a schematic view of a position of a projection of a first overlay mark on a second layer and a position of a second overlay mark according to further another embodiment of the present disclosure, and FIG. 12 is a schematic view of a position of a projection of a first overlay mark on a second layer and a position of a second overlay mark according to further another embodiment of the present disclosure. When the first overlay mark 11 includes three first overlay sub-marks 111, the projection of the first overlay mark 11 on the second layer 22 being located outside the closed area enclosed by the second overlay mark 12 may be illustrated in FIG. 11. When the first overlay mark 11 includes four first overlay sub-marks 111, the projection of the first overlay mark 11 on the second layer 22 being located outside the closed area enclosed by the second overlay mark 12 may be illustrated in FIG. 12.

The overlay mark 10 provided in the embodiments includes a first overlay mark 11 on a first layer 21 and a second overlay mark 12 on a second layer 22. The first overlay mark 11 is configured to include at least one first overlay sub-mark 111, and the first overlay sub-mark 111 is each circular, so as to prevent the fault of the conductive material in the first overlay sub-mark 111 caused by insufficient filling of the conductive material in the process of filling the conductive material in the first overlay sub-mark 111. In this way, the first overlay mark 11 is designed on the wafer required to be subjected to a hole-opening process; in addition, the second overlay mark 12 is configured to include a second overlay sub-mark, and the second overlay sub-mark is arranged in a center-symmetrical shape including a plurality of linear graphics, such that the first overlay mark 11 and the second overlay mark 12 may be applied to measure the overlay error of the first layer 21 to obtain the overlay error process capability of the first layer 21, thereby effectively improving the product yield.

Figure 13:
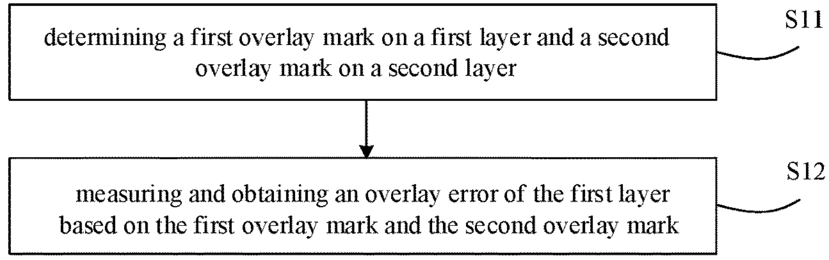
FIG. 13 is a flowchart of an overlay error measurement method for a wafer according to an embodiment of the present disclosure.

Referring to FIG. 13, FIG. 13 is a flowchart of an overlay error measurement method for a wafer according to an embodiment of the present disclosure. In this embodiment, an overlay error measurement method for a wafer is provided for measuring the overlay error of a wafer required to be subjected to a hole-opening process. Specifically, the method includes the following steps illustrated herein.

Step S11: determining a first overlay mark on a first layer and a second overlay mark on a second layer.

The first overlay mark 11 includes at least one first overlay sub-mark 111, and the first overlay sub-mark 111 is each circular; the second overlay mark 12 includes a second overlay sub-mark, and the second overlay sub-mark is arranged in a center-symmetrical shape including a plurality of linear graphics. Specifically, the specific structures and functions of the first overlay mark 11 and the second overlay mark 12 and the positional relationship between the two may be referred to the above-mentioned implementation, which will not be repeated herein.

Step S12: measuring and obtaining an overlay error of the first layer based on the first overlay mark and the second overlay mark.

Figure 14:
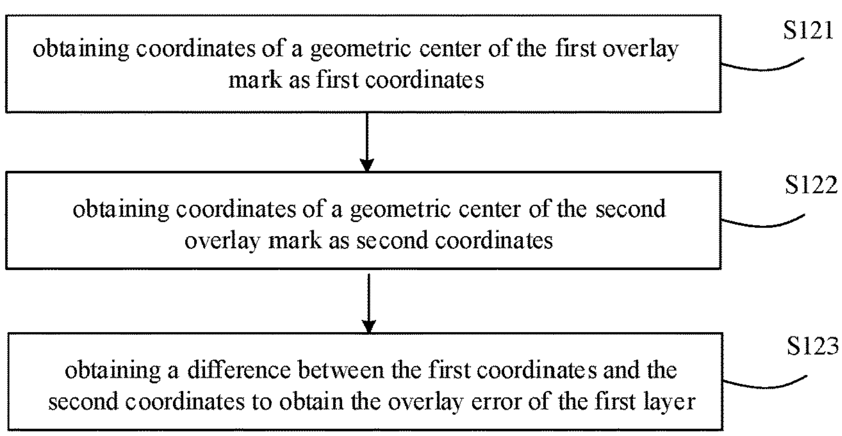
FIG. 14 is a flowchart of sub-operations of S12 in FIG. 13 according to an embodiment of the present disclosure.

Specifically, step S12 may be performed by a measurement unit. In a specific embodiment, referring to FIG. 14, FIG. 14 is a flowchart of sub-operations of S12 in FIG. 13 according to an embodiment of the present disclosure. In this embodiment, after the first layer 21 and the second layer 22 are stacked, when the first layer 21 and the second layer 22 are completely aligned, a projection of a geometric center of the first overlay mark 11 on the second layer 22 and a geometric center of the second overlay mark 12 coincide. In this case, step S12 may specifically include the following steps illustrated herein.

Step S121: obtaining coordinates of a geometric center of the first overlay mark as first coordinates.

Step S122: obtaining coordinates of a geometric center of the second overlay mark as second coordinates.

In a specific implementation, after the first layer 21 and the second layer 22 are laminated, the obtained product is placed on a measuring machine, and the coordinates of the geometric center of the first overlay mark and the coordinates of the geometric center of the second overlay mark are obtained through the measuring machine, the specific obtaining means of which may be referred to the related art to achieve same or similar technical effects, which will not be repeated herein. During the above process, the measuring machine simultaneously obtains a deflection angle of the first overlay mark 11 relative to the second overlay mark 12.

Step S123: obtaining a difference between the first coordinates and the second coordinates to obtain the overlay error of the first layer.

Specifically, horizontal offset values of the first layer 21 relative to the second layer 22 in a horizontal axis direction and a vertical axis direction may be obtained through the first coordinates and the second coordinates, and the overlay error of the first layer 21 may be obtained. It can be understood that the overlay error may specifically include the horizontal offset values in the horizontal axis direction and the vertical axis direction and the deflection angle.

For example, assuming that the obtained first coordinates are $(X_1, Y_1)$ and the second coordinates are $(X_2, Y_2)$, the horizontal offset value $X_0$ in the horizontal axis direction is $X_1-X_2$, and the horizontal offset value $Y_0$ in the vertical axis direction is $Y_1-Y_2$, the deflection angle of the first overlay mark 11 relative to the second overlay mark 12 is $\alpha_0$, the $X_0$, $Y_0$, and $\alpha_0$ are specific data of the overlay error.

Figures 15, 16:
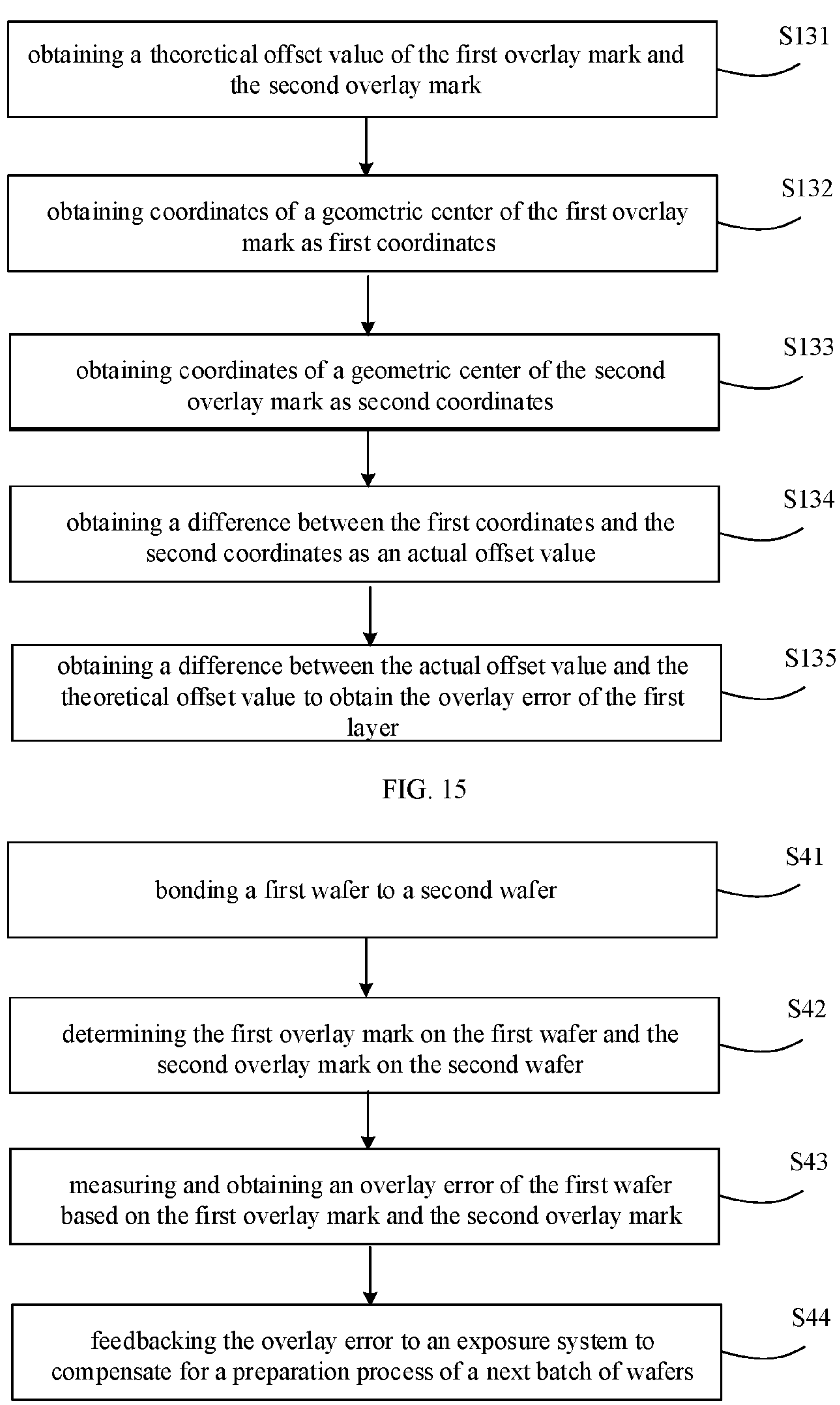
FIG. 15 is a flowchart of sub-operations of S12 in FIG. 13 according to another embodiment of the present disclosure.
FIG. 16 is a flowchart of a wafer stacking method according to an embodiment of the present disclosure.

In another specific embodiment, referring to FIG. 15, FIG. 15 is a flowchart of sub-operations of S12 in FIG. 13 according to another embodiment of the present disclosure. The projection of the geometric center of the first overlay mark 11 on the second layer 22 is misaligned with the geometric center of the second overlay mark 12; that is, the projection of the geometric center of the first overlay mark 11 on the second layer 22 does not coincide with the geometric center of the second overlay mark 12. In this case, step S12 may specifically include the following steps illustrated herein.

Step S131: obtaining a theoretical offset value of the first overlay mark and the second overlay mark.

It can be understood that when the projection of the geometric center of the first overlay mark 11 on the second layer 22 is not at the same position as the geometric center of the second overlay mark 12, the two corresponds to different coordinates. In this case, the coordinates of the geometric center of the first overlay mark 11 and the second overlay mark 12 and the deflection angle may be obtained, and theoretical horizontal offset values of the first overlay mark 11 relative to the second overlay mark 12 in the horizontal and vertical axis directions may be obtained based on the coordinates of the geometric centers of the first overlay mark 11 and the second overlay mark 12 to obtain the theoretical offset value. It can be understood that the theoretical offset value includes the theoretical horizontal offset values in the horizontal and vertical axis directions and the deflection angle.

For example, assuming that the coordinates of the first overlay mark 11 on the first layer 21 are $(X_1, Y_1)$, and the coordinates of the second overlay mark 12 on the second layer 22 are $(X_2, Y_2)$, the theoretical horizontal offset value in the horizontal axis direction of the second overlay mark 12 relative to the first overlay mark 11 is $X_0=X_1-X_2$, the theoretical horizontal offset value in the vertical axis direction is $Y_0=Y_1-Y_2$, and the deflection angle of the first overlay mark 11 relative to the second overlay mark 12 is $\alpha_0$. The $X_0$, $Y_0$, and $\alpha_0$ are specific data of the overlay error.

Step S132: obtaining coordinates of a geometric center of the first overlay mark as first coordinates.

Step S133: obtaining coordinates of a geometric center of the second overlay mark as second coordinates.

The first coordinates and the second coordinates may be two-dimensional coordinates.

Specifically, for the specific implementation of steps S132 to S133, reference may be made to the specific implementation of the above-mentioned steps S121 to S122 to achieve same or similar technical effects, which will not be repeated herein. The deflection angle of the first overlay mark 11 relative to the second overlay mark 12 is obtained at the same time as the first coordinates and the second coordinates are obtained.

Step S134: obtaining a difference between the first coordinates and the second coordinates as an actual offset value.

Specifically, the actual horizontal offset values of the first overlay mark 11 in the horizontal axis and the vertical axis direction are obtained according to the first coordinates and the second coordinates. For the specific implementation of obtaining the actual horizontal offset value, reference may be made to the above specific obtaining means of the theoretical horizontal offset value, which will not be repeated herein.

Step S135: obtaining a difference between the actual offset value and the theoretical offset value to obtain the overlay error of the first layer.

For example, assuming that the theoretical offset data is $(X_0, Y_0, \alpha_0)$ and the actual offset data is $(X_3, Y_3, \alpha_3)$, the overlay error is $(X_3-X_0, Y_3-Y_0, \alpha_3-\alpha_0)$; X is the horizontal offset value in the horizontal axis direction, Y is the horizontal offset value in the vertical axis direction, and a is the deflection angle.

The wafer overlay error measurement method provided in the embodiments includes determining a first overlay mark 11 on a first layer 21 and a second overlay mark 12 on a second layer 22, and measuring and obtaining an overlay error of the first layer 21 based on the first overlay mark 11 and the second overlay mark 12. The first overlay sub-mark 111 is each circular, so as to prevent the fault of broken layer of the conductive material in the first overlay sub-mark 111 caused by insufficient filling of the conductive material in the process of filling the conductive material in the first overlay sub-mark 111. In this way, the first overlay mark 11 is designed on the wafer required to be subjected to a hole-opening process. In addition, the first overlay mark 11 and the second overlay mark 12 may be applied to measure the overlay error of the first layer 21 to obtain the overlay error process capability of the first layer 21, thereby effectively improving the product yield.

Referring to FIG. 16, FIG. 16 is a flowchart of a wafer stacking method according to an embodiment of the present disclosure. In this embodiment, a method for stacking wafers is provided, and the first overlay mark 11 and the second overlay mark 12 are arranged in standard graphics. Specifically, the method includes the following steps illustrated herein.

Step S41: bonding a first wafer to a second wafer.

A first overlay mark 11 is formed on the first wafer, and a second overlay mark 12 is formed on the second wafer. Specifically, the first overlay mark 11 includes at least one first overlay sub-mark 111, and each first overlay sub-mark

111 is circular. The first overlay sub-mark 111 may specifically be a circular through hole, which is formed at the same time as the circular hole-opening process. The second overlay mark 12 includes a second overlay sub-mark, and the second overlay sub-mark is in a center-symmetrical shape including a plurality of linear graphics. Specifically, the specific structures and functions of the first overlay mark 11 and the second overlay mark 12 and the positional relationship between the two may be referred to the above-mentioned implementation, which will not be repeated herein. It can be understood that the first wafer is equivalent to the first layer 21 in the above embodiments, and the second wafer is equivalent to the second layer 22 in the above embodiments.

In a specific implementation, at least one circular hole is defined on a surface of the first wafer away from a bonding interface between the first wafer and the second wafer and filled with material to form the first overlay mark 11. Specifically, the circular hole is defined in a non-device area of the first wafer, for example, at a position where a dicing line of the first wafer is located. In a specific implementation, the circular hole may be filled with conductive material for connecting the first wafer and the second wafer at the same time during the process of forming the first overlay mark 11.

Specifically, the structure and arrangement of the at least one circular hole in the embodiments are the same or similar to the structure and arrangement of the overlay mark 10 provided in the above-mentioned embodiment, and can achieve same or similar technical effects, which will not be repeated herein.

Step S42: determining the first overlay mark on the first wafer and the second overlay mark on the second wafer.

Step S43: measuring and obtaining an overlay error of the first wafer based on the first overlay mark and the second overlay mark.

Specifically, the specific implementation of steps S42 to S43 is the same as or similar to the specific implementation of the above-mentioned steps S11 to S12 to achieve same or similar technical effects. For details, reference may be made to the above description.

Step S44: feedbacking the overlay error to an exposure system to compensate for a preparation process of a next batch of wafers.

Specifically, after the measuring machine measures the overlay error, the overlay error may be fed back to the exposure system through a feedback unit, such that the exposure system can establish a lithography process adjustment mechanism based on the overlay error to adjust and compensate for the process of the next batch of wafers, thereby improving the alignment accuracy between wafers while increasing product yields.

In a specific embodiment, a new overlay error measurement program may be developed according to the first overlay mark 11. Based on the newly developed overlay error measurement program, the corresponding APC data feedback unit is adjusted to feed the overlay error back to the exposure system, which in turn compensates for the stacking process of the next batch of wafers.

In the wafer stacking method provided in the embodiments, the first overlay sub-mark 111 is designed to be circular, such that the first overlay sub-mark 111 may be disposed on the wafer required to be subjected to a hole-opening process, thereby utilizing the first overlay sub-mark 111 to measure the overlay error of the wafer required to be subjected to a hole-opening process, so as to obtain the overlay error of the current wafer; in addition, the overlay error is fed back to the exposure system, such that the overlay error is applied to compensate for the stacking process of the next batch of wafers, so as to prevent the offset between wafers again during the stacking process, thereby improving the product yield.

Figure 17:
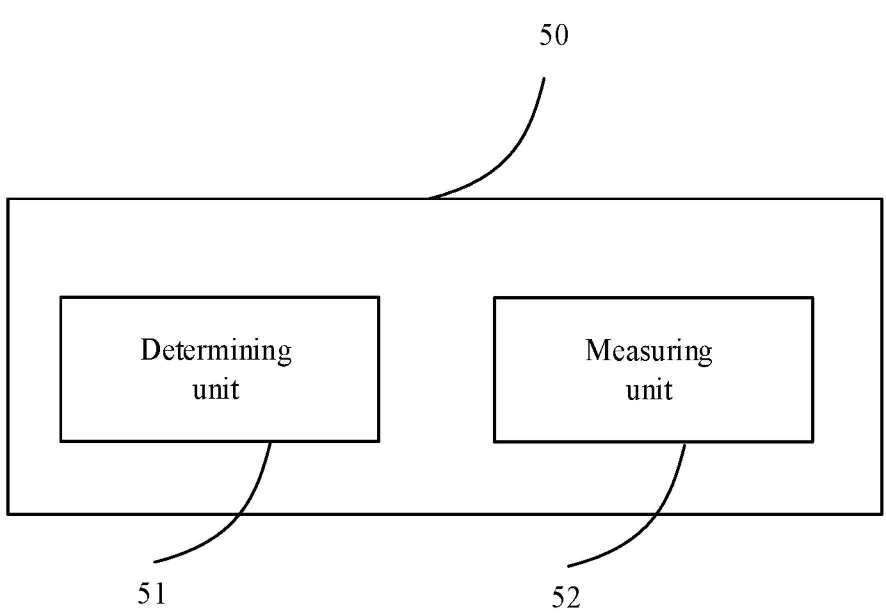
FIG. 17 is a structural schematic view of an overlay error measurement system for a wafer according to an embodiment of the present disclosure.

Referring to FIG. 17, FIG. 17 is a structural schematic view of an overlay error measurement system for a wafer according to an embodiment of the present disclosure. In this embodiment, an overlay error measurement system 50 is provided, including a determining unit 51 and a measuring unit 52.

The determining unit 51 is configured to determine a first overlay mark 11 on a first layer 21 and a second overlay mark 12 on a second layer 22. The first layer 21 and the second layer 22 are stacked. The first overlay mark 11 includes at least one first overlay sub-mark 111, and the first overlay sub-mark 111 is each circular; the second overlay mark 12 includes a second overlay sub-mark, and the second overlay sub-mark is arranged in a center-symmetrical shape including a plurality of linear graphics. Specifically, the specific structures and functions of the first overlay mark 11 and the second overlay mark 12 and the positional relationship between the two may be referred to the above-mentioned implementation, which will not be repeated herein.

The measuring unit 52 is configured to measure and obtain an overlay error of the first layer 21 based on the first overlay mark 11 and the second overlay mark 12.

In a specific embodiment, after the first layer 21 and the second layer 22 are stacked, when the first layer 21 and the second layer 22 are completely aligned, a projection of a geometric center of the first overlay mark 11 on the second layer 22 and a geometric center of the second overlay mark 12 coincide. In this case, the measuring unit is specifically configured to obtain coordinates of a geometric center of the first overlay mark 11 as first coordinates; obtain coordinates of a geometric center of the second overlay mark 12 as second coordinates, simultaneously obtain a deflection angle of the first overlay mark 11 relative to the second overlay mark 12; and obtain a difference between the first coordinates and the second coordinates to obtain the overlay error of the first layer 21.

In another specific embodiment, the projection of the geometric center of the first overlay mark 11 on the second layer 22 is misaligned with the geometric center of the second overlay mark 12; that is, the projection of the geometric center of the first overlay mark 11 on the second layer 22 does not coincide with the geometric center of the second overlay mark 12. In this case, the measuring unit is specifically configured to obtain a theoretical offset value of the first overlay mark 11 and the second overlay mark 12; obtain coordinates of a geometric center of the first overlay mark 111 as first coordinates; obtain coordinates of a geometric center of the second overlay mark 12 as second coordinates; obtain a deflection angle of the first overlay mark 11 relative to the second overlay mark 12; obtain a difference between the first coordinates and the second coordinates as an actual offset value; and obtain a difference between the actual offset value and the theoretical offset value to obtain the overlay error of the first layer 21.

In a specific embodiment, the system 50 further includes a feedback unit. In a specific implementation, after the measuring unit obtains the overlay error, the overlay error is further fed back to an exposure system through the feedback unit, so as to compensate for a preparation process of a next batch of wafers.

Specifically, after the measuring machine measures the overlay error, the overlay error may be fed back to the exposure system through a feedback unit, such that the exposure system can establish a lithography process adjustment mechanism based on the overlay error to adjust and compensate for the process of the next batch of wafers, thereby improving the alignment accuracy between wafers while increasing product yields.

In a specific embodiment, a new overlay error measurement program may be developed according to the first overlay mark 11. Based on the newly developed overlay error measurement program, the corresponding APC data feedback unit is adjusted to feed the overlay error back to the exposure system.

The above is only embodiments of the present disclosure and is not intended to limit the scope of the present disclosure. Any equivalent structure or equivalent process transformation using the contents of the specification and the accompanying drawings of the present disclosure, or any direct or indirect application in other related technical fields, is included in the scope of the present disclosure.

What is claimed is:

1. An overlay mark, comprising:

a first overlay mark disposed on a first layer, and a second overlay mark disposed on a second layer; wherein the first layer and the second layer are stacked;

the first overlay mark comprises at least one first overlay sub-mark, and each of the at least one first overlay sub-mark is circular in shape; wherein the first overlay mark is configured to measure an overlay error of a wafer required to be subjected to a circular hole-opening process, and the first overlay mark is formed at the same time as a circular hole is formed by filling conductive material in the circular hole during the circular hole-opening process; the first overlay mark is at least one conductive hole defined on the first layer for electrically connecting the first layer and the second layer;

the second overlay mark comprises a second overlay sub-mark, and the second overlay sub-mark is in a center-symmetrical shape comprising a plurality of linear graphics.

2. The overlay mark according to claim 1, wherein the number of the at least one first overlay sub-mark is one, and the at least one first overlay sub-mark is disposed in a non-device area of the wafer.

3. The overlay mark according to claim 1, wherein the number of the at least one first overlay sub-mark is two or more, and the at least one first overlay sub-mark are distributed along a same circumference and disposed in a non-device area of the first layer.

4. The overlay mark according to claim 3, wherein a distance between every two adjacent ones of the at least one first overlay sub-mark is the same.

5. The overlay mark according to claim 3, wherein a distance between every two adjacent ones of at least two of the at least one first overlay sub-mark is the same.

6. The overlay mark according to claim 3, wherein the second overlay sub-mark is in a shape composed of a first group of linear graphics and a second group of linear graphics, the first group of linear graphics comprising two first linear graphics parallel to each other, the second group of linear graphics comprising two second linear graphics parallel to each other, and the second linear graphics being perpendicular to the first linear graphics.

7. The overlay mark according to claim 6, wherein each end of each of the two first linear graphics is connected to a corresponding second linear graphic to form a closed graphic.

8. The overlay mark according to claim 6, wherein neither of the two first linear graphics and the two second linear graphics are connected.

9. The overlay mark according to claim 6, wherein a projection of the first overlay mark on the second layer is located in a closed area enclosed by the second overlay mark, and the projection of the first overlay mark does not intersect with the second overlay mark.

10. The overlay mark according to claim 6, wherein a projection of the first overlay mark on the second layer is located outside a closed area enclosed by the second overlay mark, and the projection of the first overlay mark does not intersect with the second overlay mark.

11. An overlay error measurement method for a wafer, comprising:

determining a first overlay mark on a first layer and a second overlay mark on a second layer; wherein the first layer and the second layer are stacked; the first overlay mark comprises at least one first overlay sub-mark, and each of the at least one first overlay sub-mark is circular in shape; the second overlay mark comprises a second overlay sub-mark, and the second overlay sub-mark is in a center-symmetrical shape comprising a plurality of linear graphics; and measuring and obtaining an overlay error of the first layer based on the first overlay mark and the second overlay mark;

wherein the first overlay mark is configured to measure the overlay error of a wafer required to be subjected to a circular hole-opening process, and the first overlay mark is formed at the same time as a circular hole is formed by filling conductive material in the circular hole during the circular hole-opening process; the first overlay mark is at least one conductive hole defined on the first layer for electrically connecting the first layer and the second layer.

12. The method according to claim 11, wherein the measuring and obtaining an overlay error of the first layer based on the first overlay mark and the second overlay mark comprises:

obtaining coordinates of a geometric center of the first overlay mark as first coordinates;

obtaining coordinates of a geometric center of the second overlay mark as second coordinates; and obtaining a difference between the first coordinates and the second coordinates to obtain the overlay error of the first layer.

13. The method according to claim 12, further comprising:

obtaining a deflection angle of the first overlay mark relative to the second overlay mark.

14. The method according to claim 13, wherein the obtaining a difference between the first coordinates and the second coordinates to obtain the overlay error of the first layer comprises:

obtaining a horizontal offset value of the first layer relative to the second layer in a horizontal axis direction and another horizontal offset value of the first layer relative to the second layer in a vertical axis direction through the first coordinates and the second coordinates;

wherein the overlay error comprises: the horizontal offset value in the horizontal axis direction, the horizontal offset value in the vertical axis direction, and the deflection angle.

15. The method according to claim 11, wherein the measuring and obtaining an overlay error of the first layer based on the first overlay mark and the second overlay mark comprises:

obtaining a theoretical offset value between a geometric center of the first overlay mark and a geometric center of the second overlay mark;

obtaining coordinates of the geometric center of the first overlay mark as first coordinates;

obtaining coordinates of the geometric center of the second overlay mark as second coordinates;

obtaining a difference between the first coordinates and the second coordinates as an actual offset value; and obtaining a difference between the actual offset value and the theoretical offset value to obtain the overlay error of the first layer.

16. The method according to claim 15, wherein the obtaining a theoretical offset value between a geometric center of the first overlay mark and a geometric center of the second overlay mark comprises:

obtaining a theoretical deflection angle of the first overlay mark relative to the second overlay mark;

obtaining coordinates of geometric centers of the first overlay mark and the second overlay mark; and obtaining a theoretical horizontal offset value of the first layer relative to the second layer in a horizontal axis direction and another theoretical horizontal offset value of the first layer relative to the second layer in a vertical axis direction through the coordinates of the geometric centers of the first overlay mark and the second overlay mark;

wherein the theoretical offset value comprises: the theoretical horizontal offset value in the horizontal axis direction, the theoretical horizontal offset value in the vertical axis direction, and the theoretical deflection angle.

17. The method according to claim 16, further comprising:

obtaining an actual deflection angle of the first overlay mark relative to the second overlay mark, simultaneously with the obtaining coordinates of the geometric center of the first overlay mark as first coordinates and the obtaining coordinates of the geometric center of the second overlay mark as second coordinates.

18. The method according to claim 17, wherein the obtaining a difference between the first coordinates and the second coordinates as an actual offset value comprises:

obtaining an actual horizontal offset value of the first layer relative to the second layer in the horizontal axis direction and another actual horizontal offset value of the first layer relative to the second layer in the vertical axis direction through the first coordinates and the second coordinates;

wherein the actual offset value comprises: the actual horizontal offset value in the horizontal axis direction, the actual horizontal offset value in the vertical axis direction, and the actual deflection angle.

19. A wafer stacking method, comprising:

bonding a first wafer to a second wafer; wherein a first overlay mark is formed on the first wafer; the first overlay mark comprises at least one first overlay sub-mark, and each of the at least one first overlay sub-mark is circular in shape; a second overlay mark is formed on the second wafer;

determining the first overlay mark on the first wafer and the second overlay mark on the second wafer;

measuring and obtaining an overlay error of the first wafer based on the first overlay mark and the second overlay mark; and feedbacking the overlay error to an exposure system to compensate for a preparation process of a next batch of wafers;

wherein the first overlay mark is configured to measure the overlay error of a wafer required to be subjected to a circular hole-opening process, and the first overlay mark is formed at the same time as a circular hole is formed by filling conductive material in the circular hole during the circular hole-opening process; the first overlay mark is at least one conductive hole defined on the first wafer for electrically connecting the first wafer and the second wafer.

* * * * *